US009419007B2

United States Patent
Kwon

(10) Patent No.: US 9,419,007 B2
(45) Date of Patent: Aug. 16, 2016

(54) SEMICONDUCTOR DEVICE

(71) Applicant: SK hynix Inc., Gyeonggi-do (KR)

(72) Inventor: Jae Kwan Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/570,766

(22) Filed: Dec. 15, 2014

(65) Prior Publication Data

US 2016/0020217 A1    Jan. 21, 2016

(30) Foreign Application Priority Data

Jul. 21, 2014    (KR) ........................ 10-2014-0091961

(51) Int. Cl.
| | |
|---|---|
| *H01L 27/11* | (2006.01) |
| *G11C 16/08* | (2006.01) |
| *G11C 16/04* | (2006.01) |
| *H01L 27/115* | (2006.01) |
| *G11C 7/18* | (2006.01) |

(52) U.S. Cl.
CPC ............ *H01L 27/11556* (2013.01); *G11C 7/18* (2013.01); *G11C 16/0483* (2013.01); *G11C 16/08* (2013.01); *H01L 27/11582* (2013.01); *H01L 27/11526* (2013.01); *H01L 27/11573* (2013.01)

(58) Field of Classification Search
CPC ............................ G11C 16/0483; G11C 16/08
USPC ...................................................... 365/185.13
See application file for complete search history.

(56) References Cited

U.S. PATENT DOCUMENTS

| | | | | |
|---|---|---|---|---|
| 8,310,875 B2* | 11/2012 | Sakurai | ............. | G11C 16/0483 365/185.05 |
| 8,520,440 B2* | 8/2013 | Ahn | .................. | G11C 16/0483 365/185.17 |
| 2012/0049267 A1* | 3/2012 | Jung | ................ | H01L 27/11578 257/324 |
| 2012/0099379 A1* | 4/2012 | Chu | .................. | H01L 27/11556 365/185.21 |
| 2012/0300547 A1* | 11/2012 | Choi | ................. | H01L 27/11565 365/185.05 |
| 2012/0314514 A1* | 12/2012 | Kwon | ...................... | G11C 7/18 365/189.09 |
| 2013/0010539 A1* | 1/2013 | Shim | .................. | G11C 16/0433 365/185.11 |
| 2013/0194869 A1* | 8/2013 | Choi | .................. | G11C 16/0483 365/185.11 |
| 2013/0250697 A1* | 9/2013 | Park | ....................... | G11C 16/10 365/185.25 |
| 2013/0301366 A1* | 11/2013 | Huh | ........................ | G11C 7/02 365/189.011 |
| 2013/0336062 A1* | 12/2013 | Maejima | ............ | G11C 16/0483 365/185.11 |
| 2014/0063974 A1* | 3/2014 | Yang | .................. | G11C 16/0483 365/185.23 |
| 2014/0192596 A1* | 7/2014 | Rhie | ................... | G11C 11/5635 365/185.17 |
| 2016/0049201 A1* | 2/2016 | Lue | ......................... | G11C 16/14 365/185.11 |
| 2016/0064388 A1* | 3/2016 | Nam | ................... | H01L 27/1157 257/391 |

* cited by examiner

*Primary Examiner* — Amir Zarabian
*Assistant Examiner* — Roberto Mancera
(74) *Attorney, Agent, or Firm* — IP & T Group LLP

(57) ABSTRACT

A semiconductor device includes a first vertical memory string connected to a common source line, a second vertical memory string connected to a bit line, a pipe transistor suitable for selectively connecting the first and second vertical memory strings based on a block selection signal, and a plurality of transistors suitable for selectively connecting local lines of the first and second vertical memory strings to corresponding global lines based on the block selection signal.

14 Claims, 7 Drawing Sheets

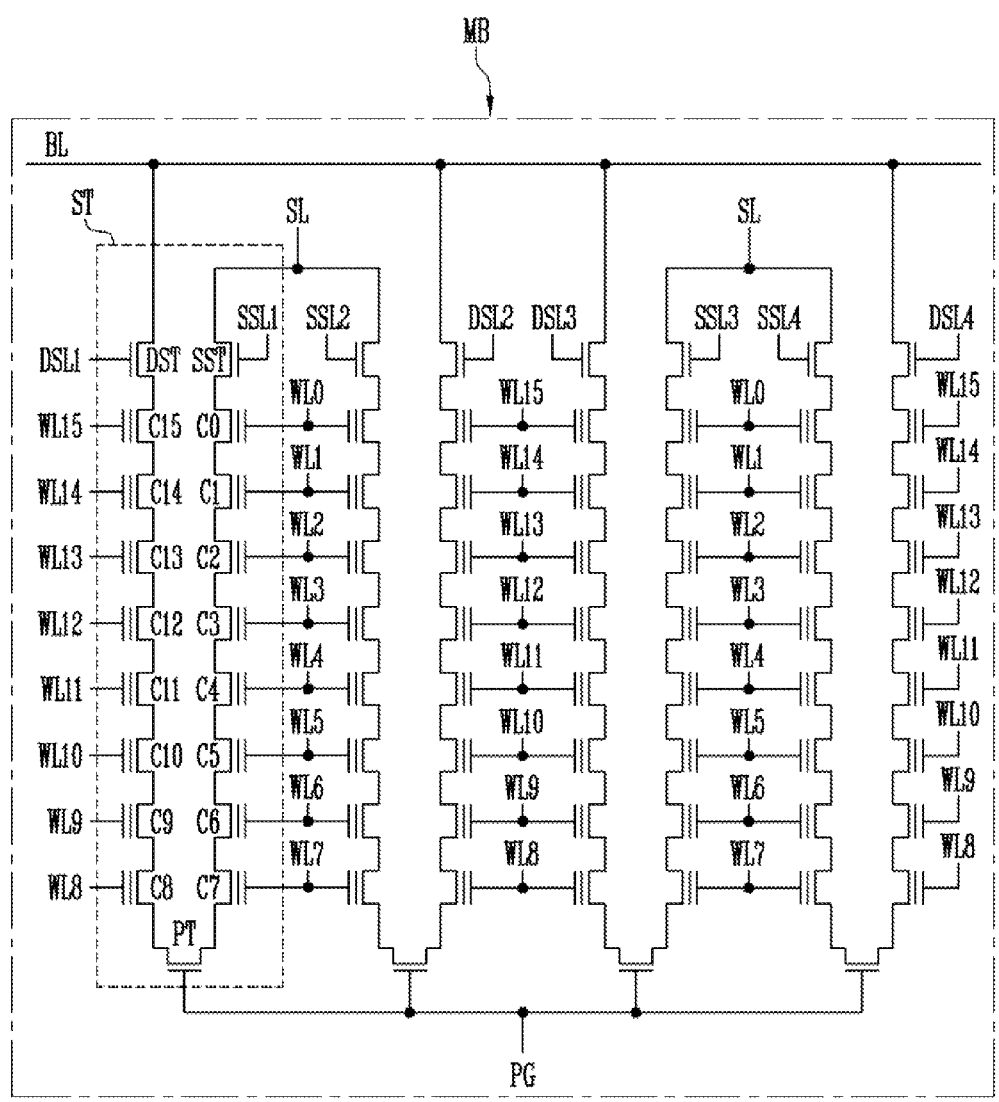

SEMICONDUCTOR DEVICE

CROSS-REFERENCE TO RELATED APPLICATION

The present application claims priority to Korean Patent Application Number 10-2014-0091961 filed on Jul. 21, 2014 the entire disclosure of which is incorporated herein in its entirety by reference.

BACKGROUND

1. Field of Invention

Various embodiments of the present invention relate to a semiconductor device, and more specifically, to a semiconductor device including memory cells.

2. Description of Related Art

In order to increase the number of memory cells integrated in a predetermined area, the memory cells are formed to have a three dimensional (3D) structure. Thus, operation circuits for controlling the memory cells and lines for connecting the memory cells are required to be changed for the 3D structured cells.

SUMMARY

Various embodiments of the present invention are directed to a semiconductor device having an improved connection structure for efficiently connecting memory blocks and operation circuits.

An embodiment of the present invention provides a semiconductor device including: a first vertical memory string connected to a common source line; a second vertical memory string connected to a bit line; a pipe transistor suitable for selectively connecting the first and second vertical memory strings based on a block selection signal; and a plurality of transistors suitable for selectively connecting local lines of the first and second vertical memory strings to corresponding global lines based on the block selection signal. Gates of the transistors are electrically connected to a gate of the pipe transistor.

An embodiment of the present invention provides a semiconductor device including: a memory block including a pipe transistor, a first vertical memory string connected between the pipe transistor and a common source line, and a second vertical memory string connected between the pipe transistor and a bit line; a connection circuit including a plurality of transistors suitable for connecting local lines of the first and second vertical memory strings to corresponding global lines based on a block selection signal; and a decoder suitable for outputting the block selection signal to the transistors of the connection circuit and a gate of the pipe transistor based on an address signal.

An embodiment of the present invention provides a semiconductor device including: a plurality of memory blocks, each of the memory blocks including a pipe transistor, a first vertical memory string connected between the pipe transistor and a common source line, and a second vertical memory string connected between the pipe transistor and a bit line; and an operation circuit suitable for connecting local lines of the first and second vertical memory strings to corresponding global lines based on a block selection signal generated by using an address of a selected memory block of the memory blocks. The operation circuit applies the block selection signal to a gate of the pipe transistor of the selected memory block.

According to the embodiments of the present invention, the connection structure for connecting a memory block and operation circuits may be improved so that manufacturing processes and costs are decreased and semiconductor elements included in a semiconductor device may be efficiently arranged.

BRIEF DESCRIPTION OF THE DRAWINGS

The above and other features and advantages of the present invention will become more apparent to those of ordinary skill in the art by describing in detail embodiments thereof with reference to the attached drawings in which:

FIGS. 2B and 2C are circuit diagrams illustrating a memory block included in a memory array shown in FIG. 1;

DETAILED DESCRIPTION

Figure 1:
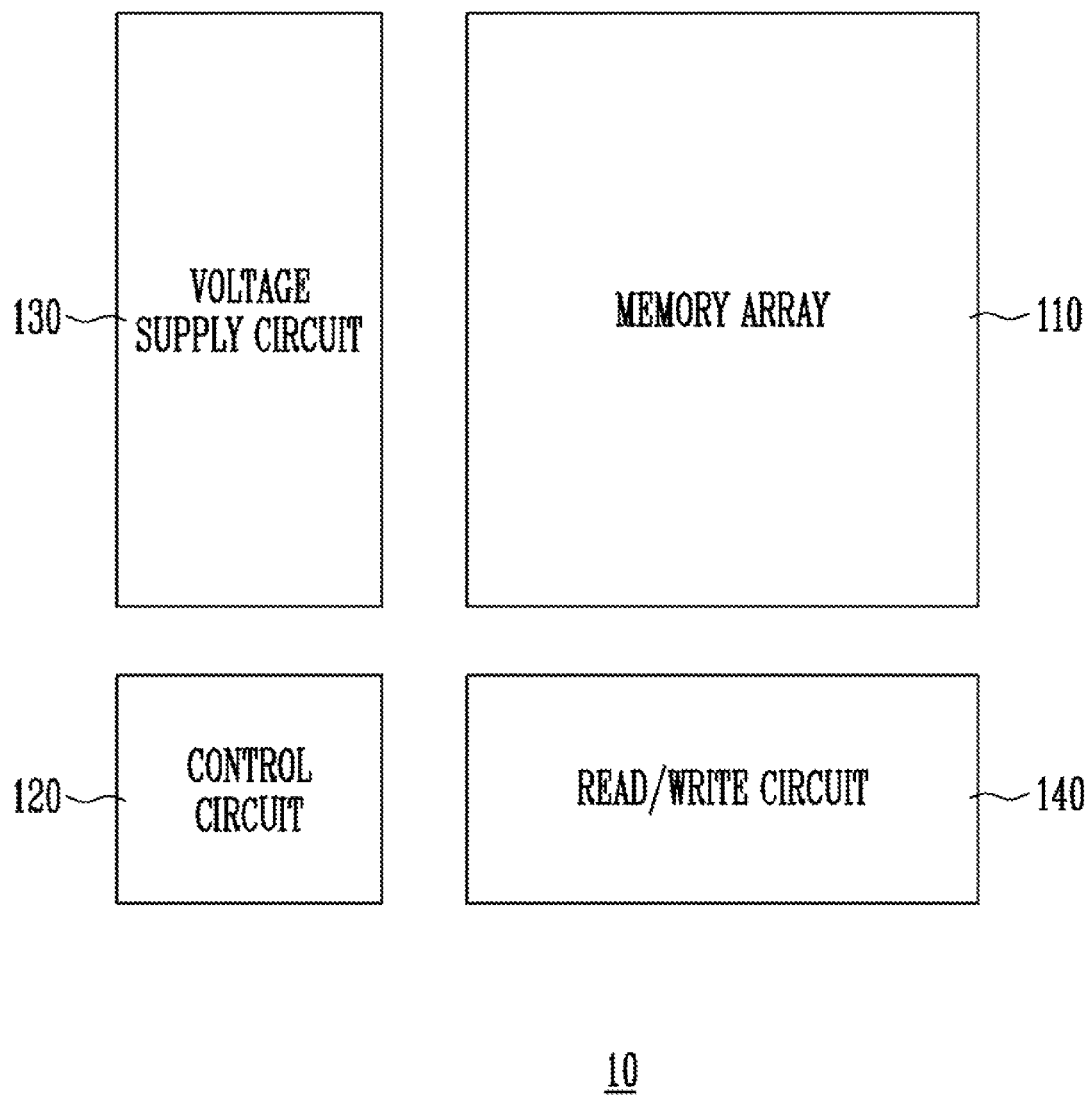
FIG. 1 is a block diagram illustrating a semiconductor device according to an embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a block diagram illustrating a semiconductor device 10 according to an embodiment of the present invention.

Referring to FIG. 1, the semiconductor device 10 may include a memory array 110 and operation circuits 120 to 140. The memory array 110 includes a plurality of memory blocks.

Each of the memory blocks includes a plurality of memory strings. Each of the memory strings includes a plurality of memory cells. In a flash memory device, the respective memory block may include a plurality of flash memory cells, for example, including a floating gate formed of polysilicon or a charge storage layer formed of nitride.

In particular, the respective memory blocks include the memory strings connected to each of the bit lines and connected in parallel with a common source line. The memory strings may be formed on a semiconductor substrate as a three dimensional structure.

Figure 2A:
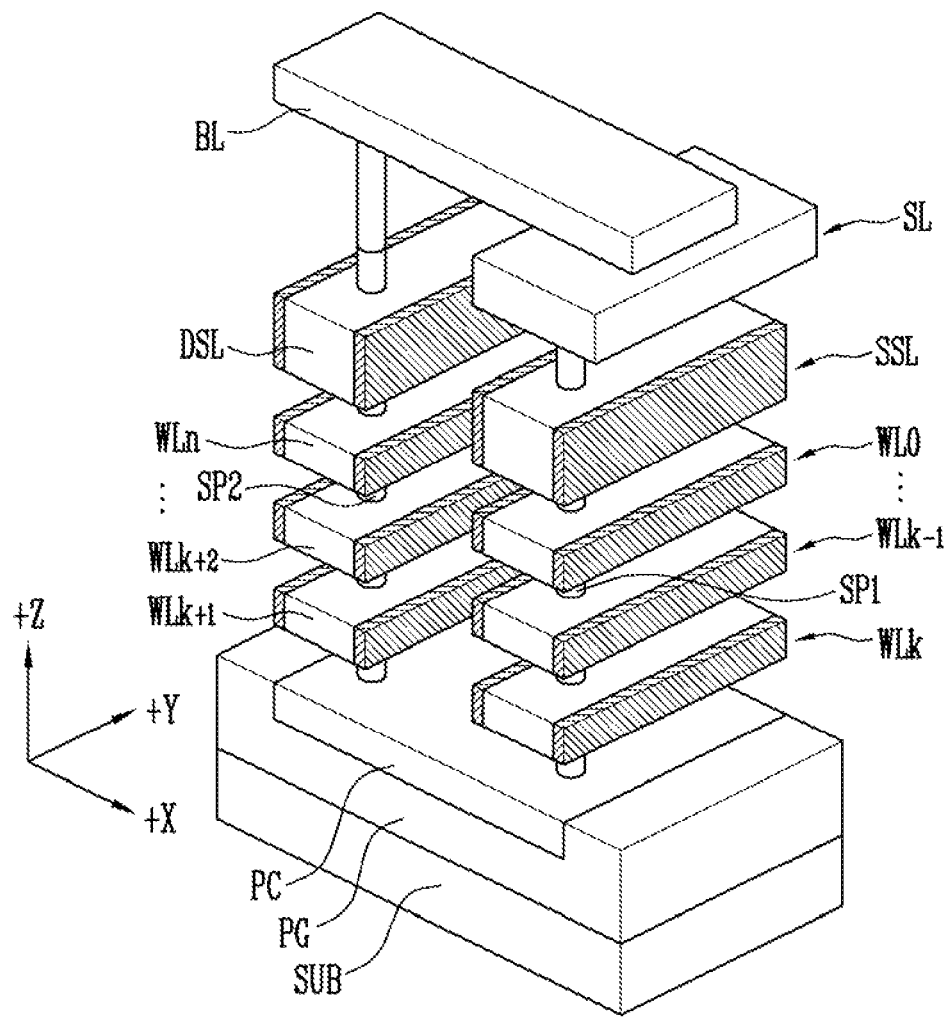
FIG. 2A is a perspective view illustrating a memory block included in a memory array shown in FIG. 1.
Figure 2B:
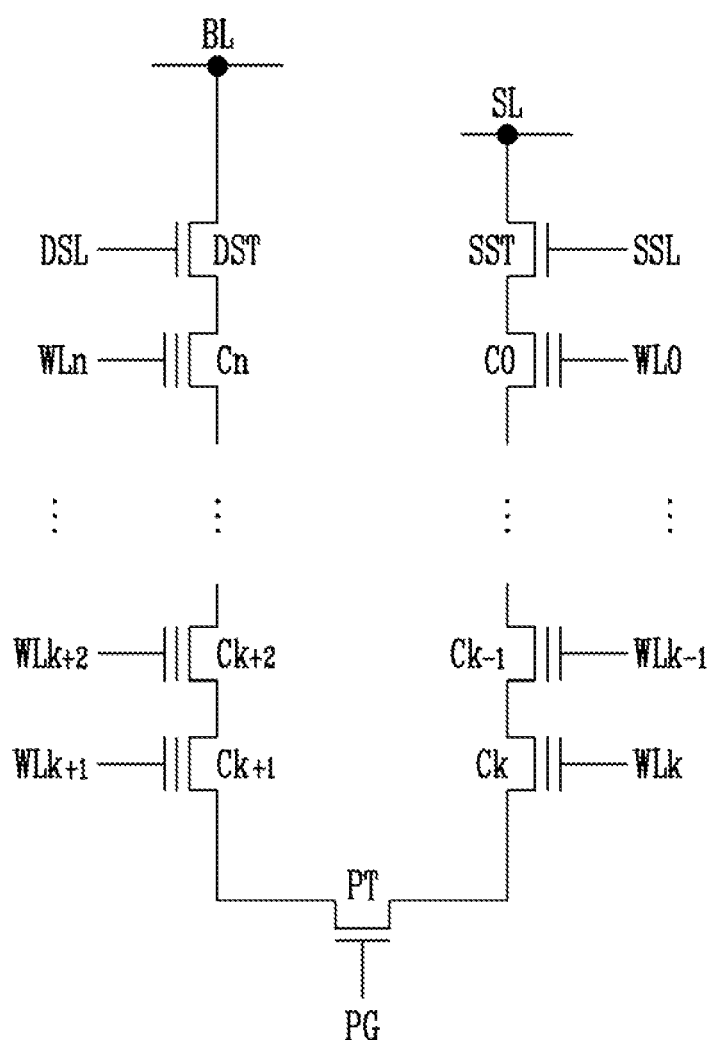

FIG. 2A is a perspective view illustrating a memory block included in the memory array 110 shown in FIG. 1. FIGS. 2B and 2C are circuit diagrams illustrating the memory block.

Referring to FIGS. 2A and 2B, a pipe gate PG including a recessed part is formed on a semiconductor substrate SUB, and a pipe channel layer PC is formed in the recessed part of the pipe gate PG. A plurality of vertical channel layers SP1 and SP2 are formed on the pipe channel layer PC. An upper portion of a first vertical channel layer SP1 of a pair of the vertical channel layers SP1 and SP2 is connected to a common source line SL. An upper portion of a second vertical channel layer SP2 of the pair of the vertical channel layers SP1 and SP2 is connected to a bit line BL. The vertical channel layers SP1 and SP2 may be formed of polysilicon.

A plurality of conductive layers DSL, WLk+1 to WLn are formed to surround the second vertical channel layer SP2 at different heights of the second vertical channel layer SP2. In addition, a plurality of conductive layers SSL, WL0 to WLk are formed to surround the first vertical channel layer SP1 at different heights of the first vertical channel layer SP1. Multiple layers (not shown), including a charge storage layer is formed on surfaces of the vertical channel layers SP1 and SP2 and a surface of the pipe channel layer PC. The multiple layers are also disposed between the vertical channel layers SP1 and SP2 and the conductive layers DSL, WLk+1 to WLn to WLk+1, SSL, WL0 to WLk and also disposed between the pipe channel layer PC and the pipe gate PG.

The uppermost conductive layer surrounding the second vertical channel layer SP2 may be a drain select line DSL, and the remaining conductive layers disposed under the drain select line DSL may be word lines WLk+1 to WLn. A portion of the conductive layers used for the word lines WLk+1 to WLn may be dummy word lines. The uppermost conductive layer surrounding the first vertical channel layer SP1 may be a source select line SSL, and the remaining conductive layers disposed under the source select line SSL may be word lines WL0 to WLk. A portion of the conductive layers used for the word lines WL0 to WLk may be dummy word lines.

That is, the first conductive layers SSL, WL0 to WLk, and the second conductive layers DSL, WLk+1 to WLn, may be stacked in different regions of the semiconductor substrate SUB. The first vertical channel layer SP1 passing through the first conductive layers SSL, WL0 to WLk is vertically connected between the common source line SL and the pipe channel layer PC. The second vertical channel layer SP2 passing through the second conductive layers DSL, WLk+1 to WLn is vertically connected between the bit line BL and the pipe channel layer PC.

A drain select transistor DST is formed in a region in which the second vertical channel layer SP2 is surrounded by the drain select lute DSL. A plurality of main cell transistors Cn to Ck+1 are formed in regions in which the second vertical channel layer SP2 is surrounded by the word lines WLk+1 to WLn. A source select transistor SST is formed in a region in which the first vertical channel layer SP1 is surrounded by the source select line SSL. A plurality of main cell transistors C0 to Ck are formed in regions in which the first vertical channel layer SP1 is surrounded by the word lines WL0 to WLk.

According to the above-mentioned structure, the memory string may include the drain select transistor DST and the main cell transistors Cn to Ck+1 which are vertically connected to the substrate between the bit line BL and the pipe channel layer PC, and the source select transistor SST and the main cell transistors C0 to Ck which are vertically connected to the substrate between the common source line SL and the pipe channel layer PC. In the above-mentioned structure, a dummy cell transistor may further be connected between the select transistor DST or SST and the main cell transistor Cn or C0, and a dummy cell transistor (not shown) may further be connected between the main cell transistor Ck+1 or Ck and a pipe transistor PT.

The source select transistor SST and the main cell transistors C0 to Ck, which are connected between the common source line SL and the pipe transistor PT, may form a first vertical memory string. The drain select transistor DST and the main cell transistors Cn to Ck+1, which are connected between the bit line BL and the pipe transistor PT, may form a second vertical memory string.

Referring to FIG. 2C, the memory block MB includes a plurality of memory strings ST connected to the bit lines. In a P-BiCS structure, each of the memory strings ST includes a first vertical memory string SST, C0 to C7 and a second vertical memory string C8 to C15, DST. The first vertical memory string SST, C0 to C7 is vertically connected between the common source line SL and the pipe transistor PT of the substrate. The second vertical memory string C8 to C15 DST is vertically connected between the bit line BL and the pipe transistor PT of the substrate. The first vertical memory string SST, C0 to C7 includes the source select transistor SST and the memory cells C0 to C7. The source select transistor SST is controlled by a voltage applied to the source select line SSL1. The memory cells C0 to C7 are controlled by voltages applied to the stacked word lines WL0 to WL7. The second vertical memory string C8 to C15, DST includes the drain select transistor DST and the memory cells C8 to C15. The drain select transistor DST is controlled by a voltage applied to the drain select line DSL1. The memory cells C8 to C15 are controlled by voltages applied to the stacked word lines WL8 to WL15.

When one of the memory blocks MB is selected, the pipe transistor PT connected between a pair of memory cells C7 and C8 performs a connection operation to electrically connect channel layers of the first vertical memory string SST, C0 to C7 of the selected memory block MB to channel layers of the second vertical memory string C8 to C15, DST of the selected memory block MB. The pair of the memory cells C7 and C8 are disposed on a central portion of the memory string of the P-BiCS structure.

In a memory block of a 2D structure, each of the bit lines is connected to the respective memory strings, and one drain select line simultaneously controls the drain select transistors of the memory block. However, in the memory block MB of the 3D structure, each bit line BL is commonly connected to the memory strings ST. Each memory block MB is commonly connected to one bit line BL, and the number of the memory strings ST controlled by the same word line may be changed according to the circuit design.

When the memory strings are connected in parallel to one bit line BL, the drain select transistors DST that may selectively connect the bit line BL to the memory strings ST are independently controlled by select voltages applied to the drain select lines DSL1 to DSL4.

The memory cells C0 to C7 of the first vertical memory string SST, C0 to C7 and the memory cells C8 to C15 of the second vertical memory string C8 to C15, DST, which are vertically connected in the memory block MB, are individually controlled by the operation voltages applied to the stacked word lines WL0 to WL7 and the stacked word lines WL8 to WL15. The word fines WL0 to WL15 are divided in units of a memory block.

The select lines DSL and SSL and the word lines WL0 to WL15 may be local lines of the memory block MB. In particular, the source select line SSL and the word lines WL0 to WL7 may be the local lines of the first vertical memory string, and the drain select line DSL and the word lines WL8 to WL15 may be the local lines of the second vertical memory string. The gates PG of the pipe transistors PT in the memory block MB may be commonly connected.

Referring again to FIGS. 1 and 2B, the operation circuits 120 to 140 may perform a program loop, an erase loop, and a read operation of the memory cells C0 connected to the selected word line (for example, WL0). The program loop includes a program operation and an inspect operation. The erase loop includes an erase operation and an inspect operation. The operation circuits 120 to 140 may perform a program operation (or a post-program operation) that controls an erase level after the erase loop. Threshold voltages of the memory cells are distributed in the erase level.

In order to perform the program loop, the erase loop, and the read operation, the operation circuits 120 to 140 may selectively output the operation voltages to the local lines SSL, WL0 to WLn, and DSL of the selected memory block and the common source line SL, to control precharge/discharge of the bit lines BL, or to sense a current flow (or a voltage variation) of the bit lines BL.

In a NAND flash memory device, the operation circuits include a control circuit 120, a voltage supply circuit 130, and a read/write circuit 140. The elements of the NAND flash memory device will be described in detail.

The control circuit 120 generates the operation voltages of predetermined levels to perform the program loop, the erase loop, and the read operation in response to a command signal that is provided from outside (e.g. an external source or device). The control circuit 120 also controls the voltage supply circuit 130 to apply the operation voltages to the local lines SSL, WL0 to WLn, and DSL of the selected memory block and the common source line SL. In addition, the control circuit 120 controls the precharge/discharge of the bit lines BL based on data to be stored in the memory cells to perform the program loop, the erase loop, and the read operation. The control circuit 120 also controls the read/write circuit 140 to sense the current flow (or the voltage variation) of the bit lines BL during the read operation or the inspect operation.

The voltage supply circuit 130 generates the operation voltages required for the program loop, the erase loop, and the read operation of the memory cells based on the control of the control circuit 120. The operation voltages include a program voltage, a read voltage, an erase voltage, a pass voltage, a select voltage, a common source voltage, etc. The voltage supply circuit 130 outputs the operation voltages to the local lines SSL, WL0 to WLn, and DSL of the selected memory block and the common source line SL in response to a row address signal of the control circuit 120.

The read/write circuit 140 may include a plurality of page buffers (not shown) connected to the memory array 110 through the bit lines BL. In particular, the page buffers may be connected to the bit lines BL, respectively. That is, each of the bit lines may be connected to each of the page buffers. In the program operation, the page buffers selectively precharge the bit lines BL based on the control signal of the control circuit 120 and the data to be stored in the memory cells. In the program inspect operation or the read operation according to the control of the control circuit 120, the bit lines BL are precharged and then the read/write circuit 140 senses the voltage variation or current of the bit lines BL to latch the data read from the memory cells.

Figure 3:
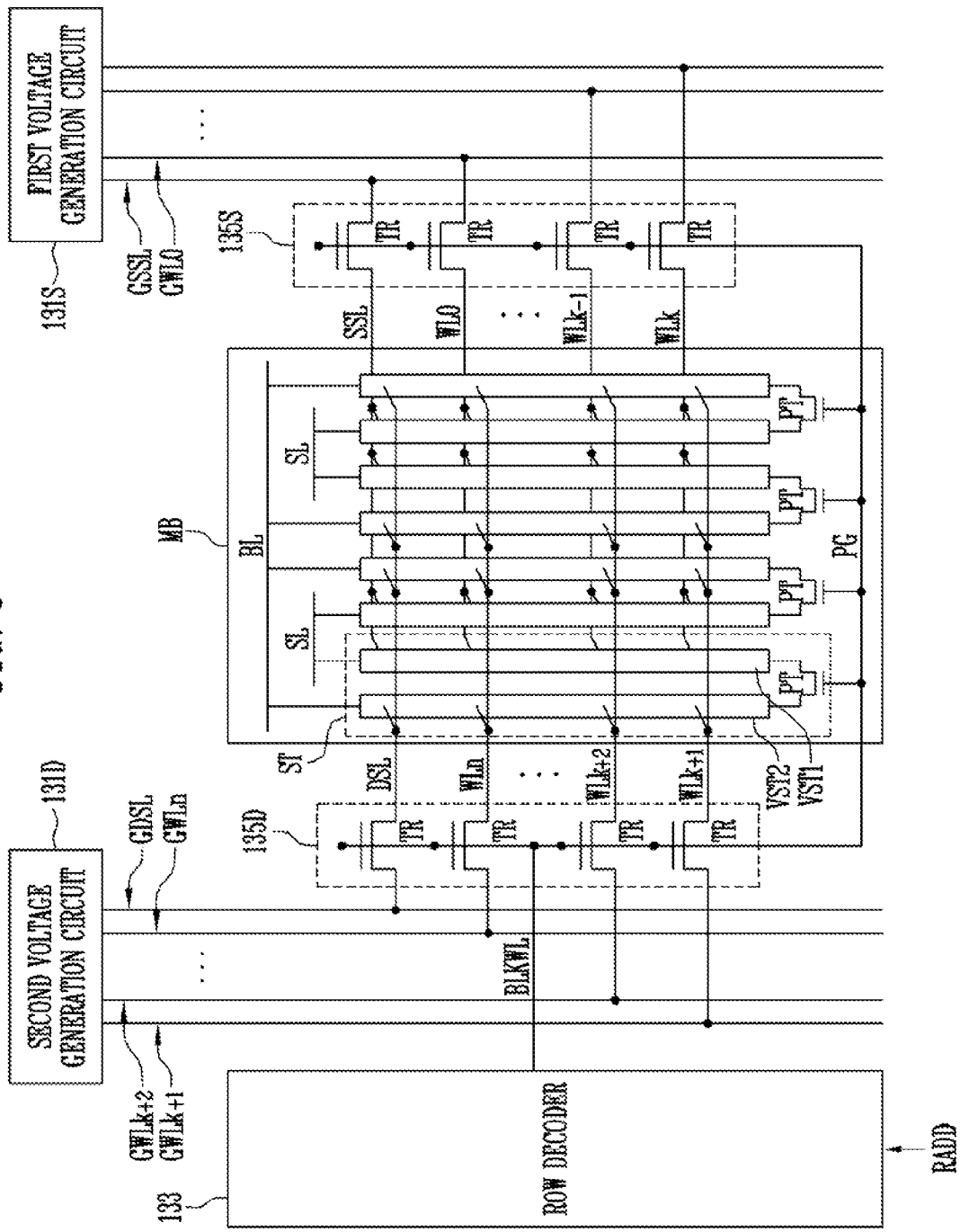
FIG. 3 is a diagram illustrating a connection relationship between a memory block and operation circuits according to an embodiment of the present invention.

Hereinafter, a connection relationship between the memory block and the operation circuits will be described in detail. FIG. 3 is a circuit diagram illustrating a connection relationship between a memory block and operation circuits according to an embodiment of the present invention.

Referring to FIG. 3 the local lines SSL, WL0 to WLn, and DSL of the memory block MB are connected to global lines GSSL, GWL0 to GWLn, and GDSL by the operation circuits (in particular, a voltage supply circuit) 131S, 131D, 133, 135S, and 135D. In particular, the operation circuits 131S, 131D, 133, 135S, and 135D generate a block selection signal BLKWL in response to an address signal (for example, the row address signal) RADD. Also, the operation circuits 131S, 131D, 133, 135S, and 135D connect the local lines SSL, WL0 to WLn, and DSL of the selected memory block MB of the memory blocks to the global lines GSSL, GWL0 to GWLn, and GDSL in response to the block selection signal BLKWL. The connection circuits 135S and 135D including transistors TR are required to connect the local' lines SSL, WL0 to WLn, and DSL to the global lines GSSL, GWL0 to GWLn, and GDSL. The global lines GSSL, GWL0 to GWLn, and GDSL may be electrically connected to the first and second voltage generation circuits 131S and 131D.

When the memory block MB includes the memory string ST of the 3D structure illustrated in FIG. 2A, the local lines SSL, WL0 to WLk of the first vertical memory string VST1 are extended in one direction of the memory block MB and the local lines DSL, WLk+1 to WLn of the second vertical memory string VST2 is extended in another direction of the memory block MB. The extended directions of the local lines may be reversed. Thus, the first connection circuit 135S that may connect the local lines SSL, WL0 to WLk to the global lines GSSL, GWL0 to GWLk is disposed on one side of the memory block MB, and the second connection circuit 135D that may connect the local lines DSL, WLk+1 to WLn to the global lines GDSL, GWLk+1 to GWLn is disposed on the other side of the memory block MB.

In order to connect the local lines SSL, WL0 to WLn, and DSL to the global lines GSSL, GWL0 to GWLn, and GDSL, the block selection signal BLKWL should be applied to the connection circuits 135S and 135D. In order to apply the block selection signal BLKWL to the row decoder 133 and the connection circuit (for example, 135S) disposed on an opposite side of the memory block MB, an additional line connected from the row decoder 133 to the opposite connection circuit 135S through an upper portion of the memory block MB may be required. The row decoder 133 may output the block selection signal BLKWL. The additional line may require complex manufacturing processes and increase manufacturing costs.

A connection structure, which may apply the block selection signal BLKWL generated from the row decoder 133 to the connection circuit 135S without the additional line, will be described as follows.

Gates of the transistors TR of one connection circuit (for example, 135D) of the connection circuits 135S and 135D may be directly connected to an output terminal of the row decoder 133 outputting the block selection signal BLKWL. Preferably, the gates of the transistors TR of the connection circuit 135 disposed between the row decoder 133 and the memory block MB may be connected to the output terminal of the row decoder 133. Alternatively, the first connection circuit 135S instead of the second connection circuit 135D may be disposed between the row decoder 133 and the memory block MB.

In addition, the gates of the transistors TR of the second connection circuit 135D may be electrically connected to the pipe gate PG of the pipe transistor PT. Also, the pipe gate PG of the pipe transistor PT is electrically connected to gates of the transistors TR of the first connection circuit 135S. That is, the gates of the transistors TR of the connection circuits 135D and 135S are connected to the pipe gate PG of the pipe transistor PT.

Thus, the row decoder 133 of the operation circuits outputs the block selection signal BLKWL that is generated in response to the address signal RADD to the pipe gate PG of the pipe transistor PT as well as the transistors TR of the connection circuits 135D and 135S. That is, when the block selection signal BLKWL is applied to the transistors TR of the second connection circuit 135D, the block selection signal BLKWL is also applied to the pipe gate PG of the pipe transistor PT through the gates of the transistors TR of the second connection circuit 135D. Also, the block selection signal BLKWL is applied to the gates of the transistors TR of the first connection circuit 135S through the pipe gate PG of the pipe transistor PT.

When the block selection signal BLKWL is activated, the local lines SSL, WL0 to WLn, and DSL of the memory block MB are connected to the global lines GSSL, GWL0 to GWLn, and GDSL through the connection circuits 135S and 135D. Also, the activated block selection signal BLKWL is applied to the pipe gate PG of the pipe transistor PT, so that the pipe transistor PT is turned on. When the pipe transistor PT is turned on, the channel of the first vertical memory string VST1 is electrically connected to the channel of the second vertical memory string VST2 through the pipe transistor PT.

According to the embodiment of the present invention, the memory block MB is connected to the operation circuits, so that the row decoder 133 applies the block selection signal BLKWL to the pipe gate PG of the pipe transistor PT. Thus, an additional signal for controlling the pipe transistor PT and an additional semiconductor element that may transmit the signal may be omitted.

Also, the gates of the transistors TR of the connection circuits 135S and 135D are connected to the pipe gate PG of the pipe transistor PT, so that the row decoder 133 may apply the block selection signal BLKWL to the first connection circuit 135S that is disposed opposite to the memory block MB through the pipe gate PG without the additional line for transmitting the block selection signal BLKWL.

TABLE 1

|  |  | BLKWL | PG |
|---|---|---|---|
| READ | Sel. BLK | Vpasspmp | Vpasspmp |
|  | Unsel. BLK | 0 V | 0 V |

Referring to Table 1, when the block selection signal BLKWL of the selected memory block is activated by the operation circuits in the read operation, the block selection signal BLKWL may have a voltage level Vpasspmp higher than a pass voltage applied to non-selected word lines by a threshold voltage of the transistor TR or more. As a result, the voltage level Vpasspmp is also applied to the pipe gate PG, and thus the channel of the first vertical memory string VST1 is electrically connected to the channel of the second vertical memory string VST2.

Meanwhile, when the block selection signal BLKWL of the non-selected memory block is deactivated by the operation circuits, the block selection signal BLKWL may have a ground voltage (i.e., 0 V). As a result, the ground voltage is applied to the pipe gate PG, and thus the channel of the first vertical memory string VST1 is electrically isolated from the channel of the second vertical memory string VST2.

TABLE 2

|  |  | BLKWL | PG |
|---|---|---|---|
| PGM | Sel. BLK | Vpepmp | Vpepmp |
|  | Unsel. BLK | 0 V | 0 V |

Referring to Table 2, when the block selection signal BLKWL of the selected memory block is activated by the operation circuits in the program operation, the block selection signal BLKWL may have a voltage level Vpepmp higher than a program voltage applied to the selected word lines by a threshold voltage of a transistor TR or more. As a result, the voltage level Vpepmp is also applied to the pipe gate PG, and thus the channel of the first vertical memory string VST1 is electrically connected to the channel of the second vertical memory string VST2.

When the block selection signal BLKWL of the non-selected memory block is deactivated by the operation circuits, the block selection signal BLKWL may have the ground voltage (i.e., 0 V). As a result, the ground voltage is applied to the pipe gate PG, and thus the channel of the first vertical memory string VST1 is electrically isolated from the channel of the second vertical memory string VST2.

TABLE 3

|  |  | BLKWL | PG | SSL (off) |
|---|---|---|---|---|
| ERASE | Sel. BLK | Verase | Verase | biased |
|  | Unsel. BLK | 0 V (channel floating) | 0 V (channel floating) | 0 V (GND) |

Referring to Table 3, when the block selection signal BLKWL of the selected memory block is activated by the operation circuits in the erase operation, the block selection signal BLKWL may have a voltage level corresponding to an erase voltage Verase. Thus, the erase voltage Verase is applied to the pipe gate PG.

When the block selection signal BLKWL of the non-selected memory block is deactivated by the operation circuits, the block selection signal BLKWL may have the ground voltage (i.e., 0 V).

Therefore, even if the gates of the transistors TR of the connection circuits 135S and 135D are connected to the pipe gate PG of the pipe transistor PT, the semiconductor device may normally operate.

Figure 4:
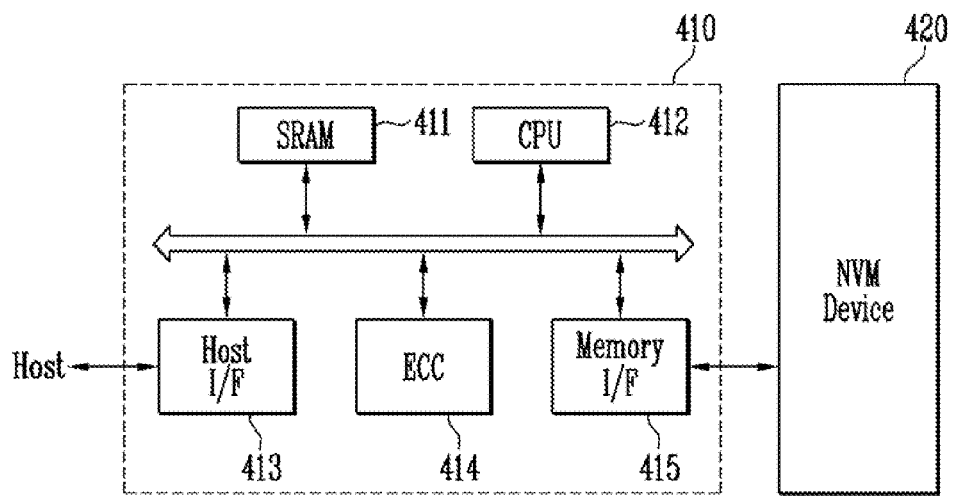
FIG. 4 is a block diagram illustrating a memory system according to an embodiment of the present invention.

FIG. 4 is a block diagram illustrating a memory system according to an embodiment of the present invention.

Referring to FIG. 4, the memory system 400 includes a nonvolatile memory device 420 and a memory controller 410.

The nonvolatile memory device 420 may correspond to the semiconductor device shown in FIG. 1. Also, the nonvolatile memory device 420 may include the memory block and the operation circuits connected to each other as shown in FIG. 3. The memory controller 410 may control the nonvolatile memory device 420. The nonvolatile memory device 420 may be combined with the memory controller 410 to form a memory card or a solid-state disk (SSD). SRAM 411 may be used for an operation memory of a central processing unit (CPU) 412. A host interface 413 includes a data exchange protocol of a host coupled with the memory system 400. An error correction code (ECC) block 414 detects and corrects an error included in the data read from a cell region of the nonvolatile memory device 420. A memory interface 415 interfaces with the nonvolatile memory device 420. The CPU 412 performs a control operation for exchanging the data by the memory controller 410.

Although not shown in FIG. 4, the memory system 400 may further include a ROM (not shown) that stores code data for interfacing with the host, etc. Those of ordinary skill in the art may understand that the memory system 400 may have various structures. The nonvolatile memory device 420 may be provided as a multi-chip package including a plurality of flash memory chips. The memory system 400 may be used for highly reliable storage media having improved operation characteristics. In particular, the SSD may include the flash memory device of the embodiments of the present invention. In this case, the memory controller 410 may communicate with an outside (for example, the host) through one of various interface protocols such as USB, MMC, PCI-E, SATA, PATA, SCSI, ESDI, IDE, etc.

Figure 5:
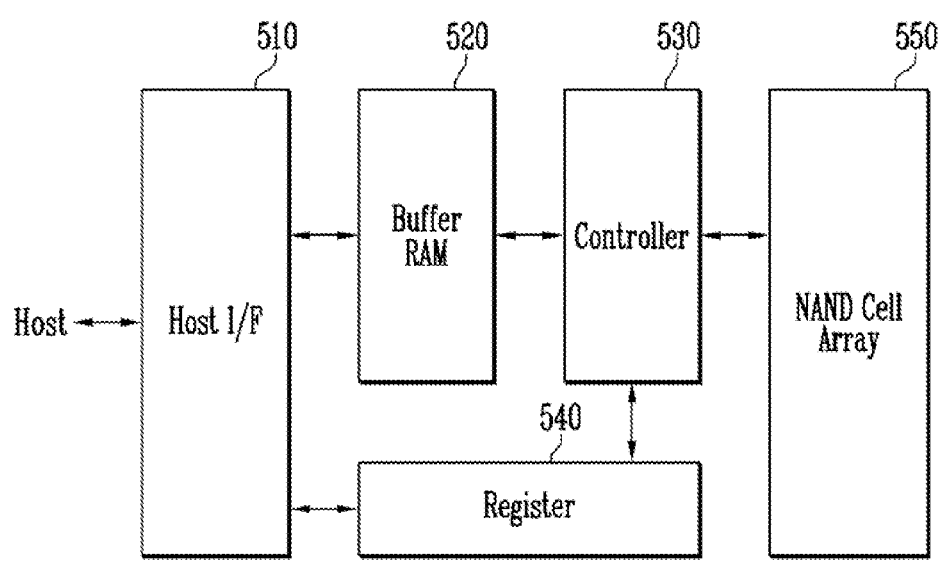
FIG. 5 is a block diagram illustrating a fusion memory device or a fusion memory system for performing an operation according to an embodiment of the present invention.

FIG. 5 is a block diagram illustrating a fusion memory device or a fusion memory system for performing an operation according to an embodiment of the present invention. For example, the fusion memory device may include a OneNAND flash memory device 500.

The OneNAND flash memory device 500 includes a host interface 510, a buffer RAM 520, a controller 530, a register 540, and a NAND flash cell array 550. The host interface 510 may exchange information with devices that use different protocols. The buffer RAM 520 includes a code for driving the memory device, or temporarily storing data. The controller 530 controls reading, programming, and other operations in response to a control signal and a command that are provided from an outside. The register 540 stores data such as the command, an address, a configuration for defining a system operation environment inside the memory device, etc. The NAND flash cell array 550 includes operation circuits having a nonvolatile memory cell and a page buffer. The OneNAND flash memory device programs the data based on general methods in response to a write request of the host.

Figure 6:
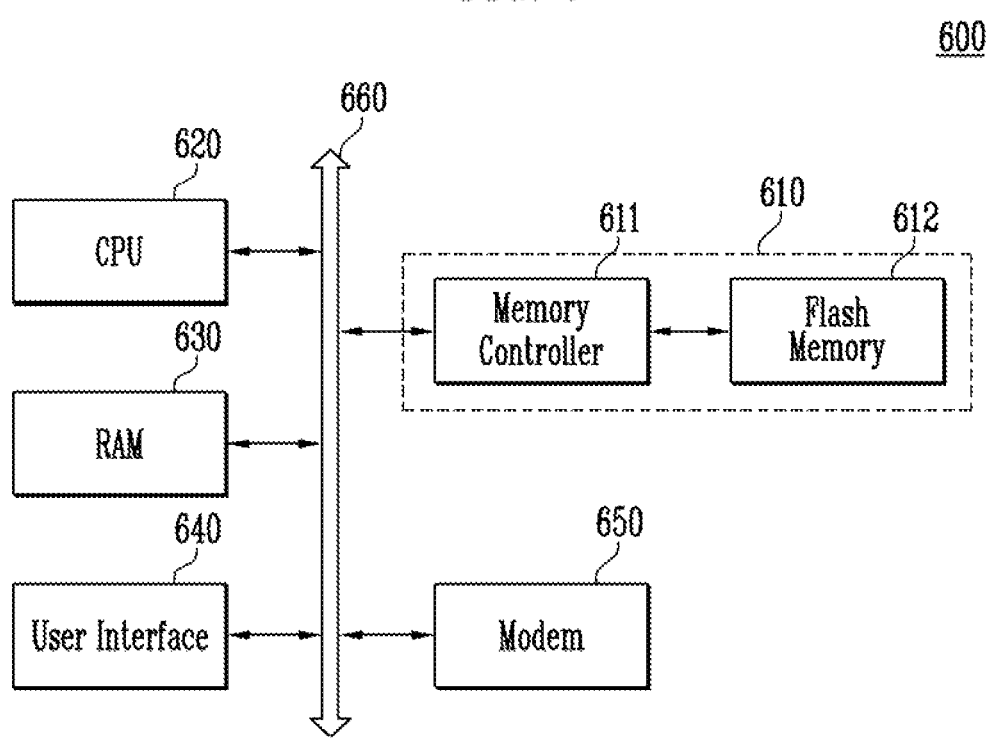
FIG. 6 is a block diagram illustrating a computing system including a flash memory device according to an embodiment of the present invention.

FIG. 6 is a block diagram illustrating a computing system including a flash memory device 612 according to an embodiment of the present invention.

The computing system 600 includes a central processing unit (CPU) 620, a RAM 630, a user interface 640, a modem 650, and a memory system 610, each of which is connected to a system bus 660. The modem 650 may include a baseband chipset. When the computing system 600 is a mobile apparatus, the computing system 600 may further include a battery (not shown) for supplying power. Although not shown in FIG. 6, those of ordinary skill in the art may understand that the computing system 600 may further include an application chipset, a camera image processor, a mobile DRAM, etc. The memory system 610, for example, may be configured with an SSD using the nonvolatile memory shown in FIG. 1. Alternatively, the memory system 610 may be provided as a fusion flash memory (for example, a OneNAND flash memory).

In the drawings and specification, there have been disclosed typical exemplary embodiments of the invention and, although specific terms are employed, they are used in a generic and descriptive sense only and not for purpose of limitation. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A semiconductor device comprising:
a first vertical memory string coupled to a source line;
a second vertical memory string coupled to a bit line;
a pipe transistor suitable for connecting the first and second vertical memory strings based on a block selection signal; and
a plurality of transistors suitable for connecting, based on the block selection signal, first local lines of the first vertical memory string and second local lines of the second vertical memory string to corresponding first global lines and second global lines, respectively,
wherein gates of the transistors are electrically coupled to a gate of the pipe transistor.

2. The semiconductor device of claim 1, wherein the transistors comprise first transistors suitable for connecting the first local lines to the first global lines, and second transistors suitable for connecting the second local lines to the second global lines, and
wherein the first and second vertical memory strings and the pipe transistor are disposed between the first transistors and the second transistors.

3. The semiconductor device of claim 1, wherein the transistors comprise first transistors suitable for connecting the first local lines to the first global lines, and second transistors suitable for connecting the second local lines to the second global lines, and
wherein the block selection signal is applied to gates of the first transistors or gates of the second transistors through the gate of the pipe transistor.

4. The semiconductor device of claim 1, wherein the block selection signal is directly applied to gates of first transistors, of the transistors, and is applied to gates of second transistors, of the transistors, through the gate of the pipe transistor.

5. The semiconductor device of claim 1, wherein the first local lines comprise first word lines and a source select line, and the second local lines comprise second word lines and a drain select line, and
wherein the first global lines comprise first global word lines and a global source select line, and the second global lines comprise second global word lines and a global drain select line.

6. A semiconductor device comprising:
a memory block including:
a pipe transistor;
a first vertical memory string coupled between the pipe transistor and a source line; and
a second vertical memory string coupled between the pipe transistor and a bit line;
a connection circuit including a plurality of transistors suitable for connecting, based on a block selection signal, first local lines of the first vertical memory string and second local lines of the second vertical memory strings to corresponding first global lines and second global lines, respectively; and
a decoder suitable for outputting the block selection signal to the transistors of the connection circuit and a gate of the pipe transistor based on an address signal.

7. The semiconductor device of claim 6, wherein gates of the transistors of the connection circuit are electrically coupled to the gate of the pipe transistor.

8. The semiconductor device of claim 6, wherein the connection circuit comprises a first connection circuit including a plurality of transistors suitable for connecting the first local lines to the first global lines, and a second connection circuit including a plurality of transistors suitable for connecting the second local lines to the second global lines, wherein the first connection circuit is disposed on one side of the memory block, and the second connection circuit is disposed on the other side of the memory block.

9. The semiconductor device of claim 6, wherein the connection circuit comprises a first connection circuit including a plurality of transistors suitable for connecting the first local lines to the first global lines, and a second connection circuit including a plurality of transistors suitable for connecting the second local lines to the second global lines, wherein gates of the transistors of the first and second connection circuits are coupled to the gate of the pipe transistor.

10. The semiconductor device of claim 6, wherein the block selection signal is applied from the decoder to first transistors of the transistors of the connection circuit, which are disposed between the decoder and the memory block, and the block selection signal is applied from the decoder to second transistors of the transistors of the connection circuit through the gate of the pipe transistor.

11. The semiconductor device of claim 6, wherein the first local lines comprise first word lines and a source select line, and the second local lines comprise second word lines and a drain select line, and wherein the first global lines comprise first global word lines and a global source select line, and the second global lines comprise second global word lines and a global drain select line.

12. A semiconductor device comprising:
a plurality of memory blocks, each of the memory blocks including:
a pipe transistor;
a first vertical memory string coupled between the pipe transistor and a source line; and
a second vertical memory string coupled between the pipe transistor and a bit line; and
an operation circuit suitable for connecting, based on a block selection signal, first local lines of the first vertical memory string and second local lines of the second vertical memory string to corresponding first global lines and second global lines, respectively,
wherein the operation circuit applies the block selection signal to a gate of the pipe transistor of the selected memory block.

13. The semiconductor device of claim 12, wherein gates of transistors for connecting the local lines to the global lines, which are included in the operation circuit, are connected to the gate of the pipe transistor.

14. The semiconductor device of claim 12, wherein the first local lines comprise first word lines and a source select line, and the second local lines comprise second word lines and a drain select line, and wherein the first global lines comprise first global word lines and a global source select line, and the second global lines comprise second global word lines and a global drain select line.

* * * * *